(12) United States Patent
Lowe

(10) Patent No.: US 6,949,171 B2
(45) Date of Patent: Sep. 27, 2005

(54) METHOD OF PROVIDING CONDUCTIVE TRACKS ON A PRINTED CIRCUIT AND APPARATUS FOR USE IN CARRYING OUT THE METHOD

(75) Inventor: John Michael Lowe, Leicestershire (GB)

(73) Assignee: TDAO Limited (GB)

( * ) Notice: Subject to any disclaimer, the term of this patent is extended or adjusted under 35 U.S.C. 154(b) by 531 days.

(21) Appl. No.: 10/254,269

(22) Filed: Sep. 25, 2002

(65) Prior Publication Data

US 2003/0024819 A1 Feb. 6, 2003

Related U.S. Application Data

(62) Division of application No. 09/679,577, filed on Oct. 5, 2000, now Pat. No. 6,524,462, which is a continuation of application No. PCT/GB99/00890, filed on Apr. 6, 1999.

(30) Foreign Application Priority Data

Apr. 6, 1998 (GB) .............................................. 9807280

(51) Int. Cl.$^7$ .............................................. C25D 17/00
(52) U.S. Cl. .................. 204/224 R; 204/279; 204/281; 204/206
(58) Field of Search ............................ 204/224 R, 279, 204/281, 206

(56) References Cited

U.S. PATENT DOCUMENTS

| | | |
|---|---|---|
| 2,744,859 A | 5/1956 | Rines |
| 3,506,545 A | 4/1970 | Garwin et al. |
| 3,755,089 A | 8/1973 | Rapids |
| 4,159,934 A | 7/1979 | Kadija |
| 4,220,504 A | 9/1980 | Hanley et al. |
| 4,270,986 A | 6/1981 | Smith |
| 4,304,654 A | 12/1981 | Norris |
| 4,385,968 A | 5/1983 | Gaston |
| 4,481,081 A | 11/1984 | Doubt |
| 4,564,430 A | 1/1986 | Bacon et al. |
| 4,592,808 A | 6/1986 | Doubt |
| 4,595,464 A | 6/1986 | Bacon et al. |
| 4,655,881 A | 4/1987 | Tezuka et al. |

(Continued)

FOREIGN PATENT DOCUMENTS

| | | |
|---|---|---|
| DE | 934 620 C | 10/1955 |
| DE | DT 20 636 32 | 7/1971 |
| DE | 36 03 856 A1 | 8/1987 |

(Continued)

OTHER PUBLICATIONS

DALIC Metallisation Electrochimique Selective Plating http://www.dalicworld.com/histogb.htn Mar. 30, 1998.

(Continued)

Primary Examiner—Bruce F. Bell
(74) Attorney, Agent, or Firm—DLA Piper Rudnick Gray Cary US LLP

(57) ABSTRACT

This invention is a method of providing conductive tracks on a printed circuit including coating a substrate carrying printed tracks with an electro-plating solution with a tool which provides a first electrode of an electro-plating circuit and a second electrode provided by the tracks which are to be electroplated, and a tool suitable for use in electro-plating electrically conductive regions of a substrate, the tool including an absorptive member in which plating solution can be carried; a first electrode of an electro-plating circuit adapted to make electrical contact with plating solution carried by the absorptive member; and at least one tool second electrode electrically insulated from the first electrode and spaced from the absorptive member, the tool second electrode being so positioned that as the absorptive member is wiped across a surface of a substrate, the second electrode contactor can be wiped across the surface of the substrate to contact electrically conductive regions of the substrate to form a second electrode of the electro-plating circuit therewith.

6 Claims, 1 Drawing Sheet

U.S. PATENT DOCUMENTS

| | | | |
|---|---|---|---|
| 4,786,389 A | | 11/1988 | Moffitt |
| 4,800,001 A | | 1/1989 | Ott et al. |
| 4,911,796 A | | 3/1990 | Reed |
| 4,952,296 A | * | 8/1990 | Wingenfeld et al. ........ 204/206 |
| 5,002,649 A | | 3/1991 | Smith |
| 5,024,735 A | | 6/1991 | Kajida |
| 5,401,369 A | * | 3/1995 | Gershin .................. 204/224 R |
| 5,409,593 A | | 4/1995 | Moskowitz |
| 5,599,595 A | | 2/1997 | McGinley et al. |
| 5,688,146 A | | 11/1997 | McGinley et al. |
| 5,713,233 A | | 2/1998 | McCarthy et al. |
| 5,985,107 A | * | 11/1999 | McLaughlin ............ 204/224 R |

FOREIGN PATENT DOCUMENTS

| | | |
|---|---|---|
| EP | 00 491 92 | 4/1982 |
| EP | DE 37 30 740 | 3/1992 |
| FR | 25 333 56 | 3/1984 |
| FR | 25 334 29 | 3/1984 |
| FR | 25 740 95 | 6/1986 |
| FR | 26 931 29 | 1/1994 |
| FR | 27 140 80 | 6/1996 |
| FR | 21 760 36 | 1/2000 |
| GB | 574 946 A | 1/1946 |
| GB | 1 077 867 | 8/1967 |
| GB | 1 175 613 | 12/1969 |
| GB | 1 556 226 | 11/1979 |
| GB | 20 606 99 | 5/1981 |
| GB | 2 192 642 A | 1/1988 |
| GB | 2 234 525 A | 2/1991 |
| JP | 56142698 A | 11/1981 |
| JP | 62 124 89 | 6/1987 |
| JP | 82 960 84 | 11/1996 |
| SU | 487164 | 10/1975 |
| WO | WO 79/00608 | 8/1979 |
| WO | WO 91/09511 | 6/1991 |
| WO | WO 97/36464 | 10/1997 |

OTHER PUBLICATIONS

DALIC Metallisation Electrochimique Selective Plating http://www.dalicworld.com/grgb.htn Mar. 30, 1998.

SIFCO What is Brush Plating http://www.sifco–sp.com/applications.htn Mar. 30, 1998.

Brooktronics Engineering Corporation—What is Brush Plating http://www.brooktronics.com/whatsbp.h Mar. 30, 1998.

Reference Manual on the Installation and Adjustment of Radio–Electronic Apparatus, I.M. Zarkh, Lenizdat 1965 (w/English translation).

* cited by examiner

METHOD OF PROVIDING CONDUCTIVE TRACKS ON A PRINTED CIRCUIT AND APPARATUS FOR USE IN CARRYING OUT THE METHOD

RELATED APPLICATION

This is a continuation of International Application No. PCT/GB99/00890, with an international filing date of Apr. 6, 1999, which is based on British Patent Application No. 9807280.4, filed Apr. 6, 1998, and is a divisional of U.S. application Ser. No. 09/679,577, filed Oct. 5, 2000 now U.S. Pat. No. 6,524,462.

FIELD OF THE INVENTION

This invention is concerned with a method of providing conductive tracks on a printed circuit and an apparatus suitable for use in carrying out the method.

BACKGROUND

A well known and convenient way of producing printed circuits includes the printing of electrically conductive tracks on a substrate, for example, using screen printing techniques. The tracks are printed using an electrically conductive ink which typically comprises a polymeric material having electrically conductive particles, for example, copper, silver or other suitable metal, dispersed in the polymeric composition. The polymeric materials are typically cured to a solid condition by subjecting them to radiation, for example, infra-red radiation or ultra-violet light.

Although the conductive inks which are used have a sufficient electrical conductivity for use in certain circumstances, the electrical conductivity has in no case been as great as the electrical conductivity of copper or other highly conductive metals. Even the conductive inks with the best performance have electrical conductivities which in most cases are only one tenth of the electrical conductivity of copper. It has been proposed to enhance the conductivity of the conductive tracks as continuous printed circuits by electro-plating the tracks with a suitable layer of metal, for example, copper but, in order to carry out electro-plating, it is necessary to have a continuous electrical circuit: that is not conveniently possible where the printed conductive tracks of a printed circuit are discrete and are not connected with one another. Furthermore, electro-plating has required the immersion of the substrate carrying the printed conductive tracks in a bath of suitable electro-plating solution: that technique restricts the substrates which can be subjected to such an immersion electro-plating technique—for example—paper based substrates are generally unsuitable as they will tend to be attacked and softened by the electro-plating solution. It has also been proposed to provide a more conductive coating on conductive tracks of printed inks by electroless plating. Electroless plating involves the use of plating solutions which are less stable than those commonly used in electro-plating and the process is less readily controlled. Furthermore, electroless plating still requires the substrate to be immersed in the plating solution with the consequent possibilities of attack of the substrate as well as being restricted in the thickness of deposit.

Thus, it would be advantageous to provide an improved method of providing conductive tracks on a printed circuit by electro-plating. It would be further advantageous to provide an improved printed circuit.

SUMMARY OF THE INVENTION

In one aspect the invention relates to a method of providing conductive tracks on a printed circuit including coating a substrate carrying printed tracks with an electro-plating solution with a tool which provides a first electrode of an electro-plating circuit and a second electrode provided by the tracks which are to be electroplated.

In another aspect the invention relates to a tool suitable for use in electro-plating electrically conductive regions of a substrate, the tool including an absorptive member in which plating solution can be carried, a first electrode of an electro-plating circuit adapted to make electrical contact with plating solution carried by the absorptive member, and at least one tool second electrode electrically insulated from the first electrode and spaced from the absorptive member, the tool second electrode being so positioned that as the absorptive member is wiped across a surface of a substrate, the second electrode contactor can be wiped across the surface of the substrate to contact electrically conductive regions of the substrate to form a second electrode of the electro-plating circuit therewith.

DETAILED DESCRIPTION OF THE INVENTION

Figure 1:
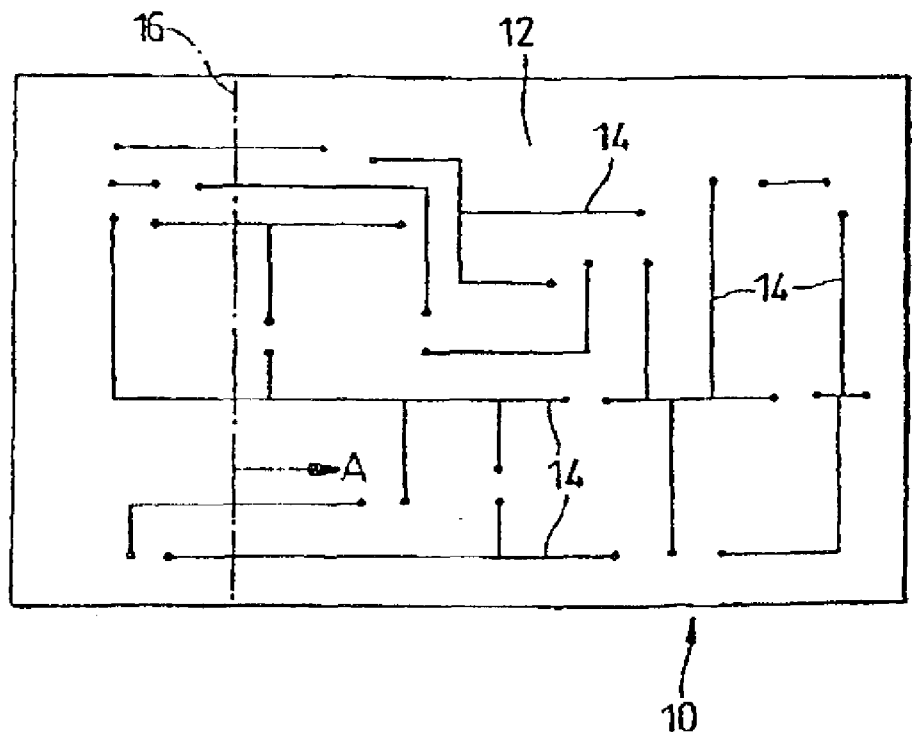
FIG. 1 is a diagrammatic plan view of a printed circuit having discrete conductive tracks showing a tool in accordance with the invention.

In one aspect the invention provides a method of providing conductive tracks on a printed circuit by electro-plating conductive tracks which have been produced by printing them onto a substrate, comprising coating a substrate carrying the printed tracks with an electro-plating solution using a tool which provides a first electrode of an electro-plating circuit and with a second electrode provided by the tracks which are to be electroplated.

In carrying out a method in accordance with the invention the ink forming the conductive tracks preferably comprises a cured polymer composition loaded with electrically conductive particles.

Conveniently in carrying out a method in accordance with the invention, a first pole of an electro-plating circuit is connected to the first electrode and a second, opposite pole of the plating circuit is connected to the second electrode.

Preferably in carrying out a method in accordance with the invention use is made of apparatus including a tool which comprises an absorptive member in which the plating solution can be carried, in which the first electrode is in electrical connection with plating solution carried by the absorptive member, and in which the coating of plating solution is applied to the substrate by wiping the absorptive member over the substrate. Conveniently the tool also comprises a second electrode, electrically insulated from the first electrode and spaced from the absorptive member, in which the second electrode is adapted to be wiped across the surface of the substrate as the absorptive member is wiped across the surface of the substrate.

In another method in accordance with the invention the conductive tracks may be treated with a scanning electron beam to ionize the tracks and create an opposite polarity to the polarity of the first electrode.

Conveniently in carrying out a method in accordance with the invention the plating solution comprises copper sulphate;

however, any suitable electro-plating solution which can be carried by the absorptive member may be used. In carrying out a method in accordance with the invention the conductive tracks are conveniently coated with plating solution sufficient to deposit a layer of copper on the tracks which is of a desired thickness, typical about 2 microns in thickness.

In another aspect the invention may be considered to provide a tool suitable for use in electro-plating electrically conductive regions of a substrate comprising an absorptive member in which the plating solution can be carried, a first electrode adapted to make electrical contact with a plating solution carried by the absorptive member, and at least one second electrode electrically insulated from the first electrode and spaced from the absorptive member, the second electrode being so positioned that as the absorptive member is wiped across a surface of a substrate the second electrode can be wiped across the said surface of the substrate.

In carrying a method in accordance with the invention, use is preferably made of a tool in accordance with the invention.

The absorptive member of a tool in accordance with the invention may be provided by any suitable means within which the plating solution may be absorbed—for example the absorptive member may comprise a brush or a flexible foam material having interconnected pores.

Suitably a tool in accordance with the invention comprises means to feed a supply of plating solution to the absorptive member.

A preferred tool in accordance with the invention comprises two electrically connected second electrodes mounted such that as the absorptive member is wiped across the surface of a substrate one of the second electrodes leads the absorptive member and the other second electrode trails the absorptive member. Conveniently, the or each second electrode is provided by a flexed electrically conductive blade, for example a flexible metal blade, e.g. of copper.

In another aspect the invention may be considered to provide a printed circuit comprising a plurality of discrete conductive tracks, each track comprising a layer of a cured electrically conductive ink on an electrically insulating substrate and a layer of conductive metal deposited on the cured ink by electro-plating.

In carrying a method in accordance with the invention it is not necessary to immerse the substrate carrying the conductive tracks in a plating bath. The quantity of plating solution which comes into contact with the substrate is very small and the method can in effect be regarded as a substantially dry electro-plating method: consequently, it is possible to electro-plate tracks on substrates which cannot be electro-plated by an immersion system. Furthermore, in carrying out the preferred method in accordance with the invention, it is not necessary that the conductive tracks be continuous, the use of a tool in accordance with the invention or the scanning electron beam technique enables discreet electrically conductive tracks to be electro-plated. A method in accordance with the invention can be controlled to provide an accurate plating thickness: the thickness of a layer applied by electro-plating is a function of current and time for which the electro-plating solution is in contact with the region to be plated. It is therefore possible to electro-plate regions of a printed circuit to provide electro-plated regions of different thickness thereby permitting adjustment of the resistance of regions of the printed circuit to provide resistors of the circuit. Such a system is particularly conveniently carried out using the scanning electron beam which can be targeted accurately on to a specific conductive track and moved rapidly to achieve the desired conductivity.

Although in carrying out a method in accordance with the invention the tool by which the plating solution is applied may be hand held, it is preferable to mount the tool in a suitable machine which may wipe the tool across the surface of the substrate carrying the conductive tracks.

A particularly preferred embodiment of aspects of the invention is shown in FIG. 1. A printed circuit 10 comprises a substrate 12 on which are printed a plurality of conductive tracks 14. The tracks 14 are printed onto the surface of the substrate 12 using a screen printing technique, the screen printing ink being provided by a polymeric composition loaded with electrically conductive silver particles and cured by exposure to ultra-violet light to provide a pattern of discrete conductive tracks. The tracks as initially printed using the UV curable ink are of relatively low conductivity.

Figure 2:
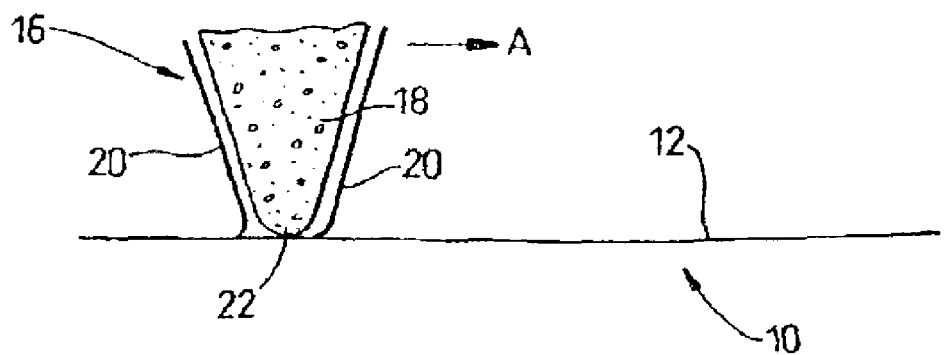
FIG. 2 is a diagrammatic side view of a tool suitable for use in carrying out a method in accordance with the invention and itself illustrating the invention in one aspect.

In carrying out the illustrative method, of enhancing the conductivity of conductive tracks which have been produced by printing them onto the substrate 12, the substrate carrying the printed tracks 14 is coated with an electro-plating solution using a tool 16 which is indicated in chain dot line on FIG. 1 and which is shown diagrammatically from the end in FIG. 2, with part broken away.

The tool 16 comprises an absorptive member 18 provided by a body of flexible foam material having interconnecting pores. The tool 16 further comprises a first electrode (not shown) which projects into the absorptive member 18. The tool further comprises a pair of second electrodes 20 mounted at either side of the absorptive member 18, closely adjacent to a tip portion 22 of the absorptive member 18 but spaced from the tip portion 22 and electrically insulated from the first electrode and from the absorptive member.

Each of the second electrodes is provided by a flexible electrically conductive blade member which is made of any suitable metal material for example a copper alloy.

In carrying out the illustrative method which can be regarded as a specialized and innovative application of the known brush plating method, the absorptive member 18 is impregnated with an electro-plating solution so that the first electrode makes electrical contact with the solution. The tool 16 is then moved into contact with the surface of the substrate 12, with the tip region 22 of the absorptive member 18 pressing lightly on the surface of the substrate 12 and with the second electrodes likewise lightly contacting the surface of the substrate 12.

After the tool 16 has been brought into contact with the surface of the substrate 12 it is wiped along the substrate 12 in the direction indicated by the arrow A on FIGS. 1 and 2. As can be seen viewing FIG. 1 the tool 16 extends completely across the substrate 16. Electro-plating solution is supplied to the absorptive member 18 in sufficient quantity that, as the tool 16 is wiped across the surface of the substrate a coating of electro-plating solution is wiped by the tool 16 across the surface of the substrate. The first electrode is connected to a positive pole of an electro-plating circuit to provide the anode, whilst both of the second electrodes 20 are connected to the negative pole of the electro-plating-plating circuit to provide the cathode. Thus, as the tool 16 is wiped across the surface of the substrate, the conductive tracks 14 are electro-plated. The electrical current supplied by the electro-plating circuit, in conjunction with the speed of travel of the tool across the surface of the substrate provides a control of the amount of electro-plating metal which is deposited on the conductive tracks and is suitably controlled to provide a layer of metal electro-plated on to the conductive tracks, which is of a desired thickness, normally between about 10 and 15 microns in thickness. Any appropriate electro-plating may be used but a common copper sulphate electro-plating solution may be appropriate.

When the surface of the substrate 12 has been treated by the tool 16, any excess electro-plating solution may be rinsed from the surface of the substrate 12, if necessary.

As the lines printed on to the substrate 12 by the curable ink may be relatively fragile the pressure exerted by the tools 16 on the substrate should be very light, just sufficient to apply the necessary electro-plating solution and to make electrical contact between the second electrodes 20 and the conductive tracks 14.

The illustrative method provides a readily controlled method of electro-plating discrete conductive tracks carried on the surface of a printed circuit substrate. As the substrate is not immersed in an electro-plating bath, and the method is a substantially "dry" method of electro-plating, with only small amounts of electro-plating solution coming into contact with the substrate, it is possible to electro-plate substrates which would be adversely affected by immersion in an electro-plating bath. Furthermore, the method allows electro-plating of discrete conductive tracks which has not hitherto been possible in any convenient manner.

What is claimed is:

1. A cool for use in electro-plating electrically conductive regions of a substrate comprising:

an absorptive member in which plating solution can be carried;

a first electrode of an electro-plating circuit adapted to make electrical contact with plating solution carried by the absorptive member; and at first one tool second electrode electrically insulated from the first electrode and spaced from the absorptive member, the tool second electrode being positioned such that as the absorptive member is wiped across a surface of a substrate, the second electrode contactor can be wiped across the said surface or the substrate to contact electrically conductive regions of the substrate to form a second electrode of the electro-plating circuit therewith.

2. A tool according to claim 1 wherein the absorptive member is a brush.

3. A tool according to claim 2 further comprising means to feed a supply of plating solution to the absorptive member.

4. A tool according to claim 2 comprising two electrically connected tool second electrodes mounted such that as the absorptive member is wiped across the surface of a substrate one of the tool second electrodes leads the absorptive member and the other tool second electrode, trails the absorptive member.

5. A tool according to claim 2 wherein the or each tool second electrode is provided by a flexible electrically conductive blade.

6. A tool according to claim 1 wherein the absorptive member comprises a flexible foam material having interconnecting pores.

* * * * *